US009872340B2

(12) United States Patent
Dahlqvist et al.

(10) Patent No.: US 9,872,340 B2
(45) Date of Patent: Jan. 16, 2018

(54) METHOD FOR INCREASING RELIABILITY IN MONITORING SYSTEMS

(71) Applicant: Axis AB, Lund (SE)

(72) Inventors: Christian Dahlqvist, Löberöd (SE); Magnus Larsson, Sölvesborg (SE)

(73) Assignee: Axis AB, Lund (SE)

( * ) Notice: Subject to any disclaimer, the term of this patent is extended or adjusted under 35 U.S.C. 154(b) by 0 days.

(21) Appl. No.: 15/265,327

(22) Filed: Sep. 14, 2016

(65) Prior Publication Data

US 2017/0079088 A1 Mar. 16, 2017

(30) Foreign Application Priority Data

Sep. 14, 2015 (EP) .................................... 15184986

(51) Int. Cl.
| | |
|---|---|
| *G03B 17/55* | (2006.01) |
| *G03B 17/56* | (2006.01) |
| *H05B 1/02* | (2006.01) |
| *G03B 37/02* | (2006.01) |
| *G01K 1/14* | (2006.01) |
| *G01R 19/165* | (2006.01) |
| *H04N 5/225* | (2006.01) |
| *F16D 61/00* | (2006.01) |

(52) U.S. Cl.
CPC ................. *H05B 1/02* (2013.01); *G01K 1/14* (2013.01); *G01R 19/16538* (2013.01); *G03B 17/55* (2013.01); *G03B 17/561* (2013.01); *G03B 37/02* (2013.01); *H04N 5/2251* (2013.01); *H05B 1/0288* (2013.01); *F16D 61/00* (2013.01); *G03B 2217/007* (2013.01)

(58) Field of Classification Search
None
See application file for complete search history.

(56) References Cited

U.S. PATENT DOCUMENTS

| | | | |
|---|---|---|---|
| 4,320,949 A | 3/1982 | Pagano | |
| 4,984,089 A * | 1/1991 | Stiepel | G03B 17/08 165/48.1 |
| 5,394,184 A * | 2/1995 | Anderson | G03B 17/55 348/151 |

(Continued)

FOREIGN PATENT DOCUMENTS

| | | |
|---|---|---|
| CA | 2 523 744 A1 | 4/2007 |
| JP | 2007 206479 A | 8/2007 |
| WO | 2007 064381 A2 | 6/2007 |

OTHER PUBLICATIONS

EP 15 18 4986.6 European Search Report (dated Mar. 21, 2016).

*Primary Examiner* — W B Perkey
(74) *Attorney, Agent, or Firm* — Volpe and Koenig, P.C.

(57) ABSTRACT

An apparatus and a method for controlling a heating device in a motorized camera directing arrangement including a motor device is disclosed. The method comprising measuring a voltage over the motor device, measuring a current conducted at least to the motor device, measuring a temperature relating to the motorized camera directing arrangement, controlling power distributed to the heating device based on the measured temperature and on the measured current, and feeding power to the heating device independent of the measured temperature and the measured current in the event that the measuring of the voltage over the motor device indicates a voltage level higher than a predetermined threshold value.

12 Claims, 2 Drawing Sheets

(56) References Cited

U.S. PATENT DOCUMENTS

| | | | |
|---|---|---|---|
| 2007/0036540 A1* | 2/2007 | Nama | G03B 17/561 396/427 |
| 2007/0126872 A1* | 6/2007 | Bolotine | G08B 13/19619 348/151 |
| 2013/0104933 A1* | 5/2013 | Aldred | G02B 27/0006 134/6 |
| 2014/0055608 A1* | 2/2014 | Martin | G08B 13/19606 348/143 |
| 2014/0247324 A1* | 9/2014 | Cury | H04N 7/183 348/36 |
| 2015/0176752 A1* | 6/2015 | Lewis | G03B 17/561 248/550 |
| 2017/0079088 A1* | 3/2017 | Dahlqvist | G01K 1/14 |

* cited by examiner

METHOD FOR INCREASING RELIABILITY IN MONITORING SYSTEMS

FIELD OF INVENTION

The disclosure relates to a method for controlling the temperature in a camera assembly. Moreover, the disclosure relates to temperature controlled and motorized camera mounting device.

BACKGROUND

Motorized camera directing arrangements, e.g. mounting brackets having pan functionality, tilt functionality, or both pan and tilt functionality, are used in order to vary the captured image view from cameras. This type of motorized camera directing arrangements for turning the image view around one or various axes is sometimes built into a camera assembly and in such cases the camera assembly may be referred to as a pan camera, a tilt camera, or a pan-tilt camera. In order to turn, the motorized camera directing arrangements includes one or a plurality of motors, gears, pivot axes, and motor controllers. At low temperatures there is a risk that one of these devices malfunctions due to the low temperature and in order to avoid such problems a heater may be arranged in the motorized mounting devices or the camera assemblies, as described in the Japanese patent application JP2007206479(A).

A problem of these types of motorized mounting devices or camera assemblies which are heated in order to experience a decreased risk of malfunction due to low temperatures relates to power consumption. A problem related to heaters and motors is that they require a lot of power. In order to limit the power consumption of the heater and the motor of JP2007206479(A) a CPU is arranged to control the heater so that the power consumption of the heater is low or it is not active at all while the motors are running. In limiting the power consumption by selectively running big power consumers the cost of the power electronics may be kept low as power electronics get more expensive the more power they are to handle.

SUMMARY

An improved motorized camera directing arrangement is disclosed.

A method for controlling a heating device in a motorized camera directing arrangement including a motor device is disclosed. The method comprises measuring a voltage over the motor device, measuring a current conducted at least to the motor device, measuring a temperature relating to the motorized camera directing arrangement, controlling power distributed to the heating device based on the measured temperature and on the measured current, and feeding power to the heating device independent of the measured temperature and the measured current in the event that the measuring of the voltage over the motor device indicates a voltage level higher than a predetermined threshold value.

One advantage of making the heater controller, in addition to heating the motorized camera directing arrangement when cold, engage the heater device when the voltage level over the motor is higher than a predetermined threshold is that the motorized camera directing arrangement may be produced using less components due to the heater being used as a break resistor burning up power surplus generated by a motor that is electrically braking.

An additional advantage of activating the heater for burning the brake energy by measuring the voltage over the motor is that the heater controller and the motor controller may be kept simple in that the heater controller may operate independent of the motor controller operations, i.e. no communication is necessary as the heater controller is arranged to act upon an effect in the electrical system of the motorized camera directing arrangement that is generated when the motor is braking. Hence, the camera assembly may be produced cost effectively and it may require less interaction between various controllers simplifying the design.

The measuring of the current may be arranged so that the combined current to the motor and the heating device is measured. In this way, it is easy to acquire an indication of the total power used by the combined heating and driving operations of the motorized camera directing, which then may be used to determine the power to be used for increase in heating power.

Further, in some embodiments, the controlling of the power distributed to the heating device also is based on the measured voltage. The advantage of measuring the voltage as well is that the power consumption may be determined more precisely, especially in a system where the voltage varies. Moreover, the measured voltage may also be used to identify fluctuations in the voltage, e.g., superimposed waveforms on top of an AC-level, this information may be used in order to have the heater use the power feed more efficiently by drawing power when the voltage peaks and avoid drawing power when it dips. Such an arrangement may further result in that capacitors of less cost may be used in the system in comparison with a system not considering the voltage fluctuation.

Moreover, the controlling of the power distributed to the heating device further may comprise dynamically setting a power limit for the heating device based on measured current and dynamically controlling the power distribution to the heating device so that the power limit is not exceeded. In this way the motorized camera directing arrangement may be heated by means of the heating device as long as the motor does not use all the power assigned for the motorized camera directing arrangement.

The feeding of power to the heating device, in the event that the measuring of the voltage over the motor device indicates a voltage level higher than a predetermined threshold value, may alternatively include comparing the measured voltage over the motor to a plurality of predetermined threshold values representing discretely increasing voltages and feeding a different amount of power to the heating device depending on the threshold exceeded by the measured voltage. In such implementation the heater may also be activated at various levels of power consumption by the motor.

In some embodiments the voltage over the motor device is measured over a capacitor arranged in parallel with the motor device.

Further, the motor may be a first motor of the motorized camera directing arrangement and the motorized camera directing arrangement may include a second motor. Moreover the current measured may be the current distributed to the motors of the motorized camera directing arrangement and the heating device.

According to another aspect a motorized camera directing arrangement includes a motor, a power supply, a current sensor, a voltage sensor, a temperature sensor, a heater controller, a motor controller, and a heater, and wherein the motorized camera directing arrangement is configured to perform the method for controlling the heating device in the motorized camera directing arrangement. The method comprises measuring a voltage over the motor, measuring a current conducted to the motor, measuring a temperature relating to motorized camera directing device, controlling power distributed to the heating device based on the measured temperature and on the measured current, and feeding power to the heating device independent of the measured temperature and the measured current in the event that the measuring of the voltage over the motor indicates a voltage level higher than a predetermined threshold value.

The motorized camera directing arrangement may further include a mounting bracket for attaching a camera to the motorized camera directing arrangement.

According to yet another aspect a camera may comprise a motorized camera directing arrangement as described above.

A further scope of applicability of the disclosure will become apparent from the detailed description given below. However, it should be understood that the detailed description and specific examples, while indicating preferred embodiments, are given by way of illustration only, since various changes and modifications will become apparent to those skilled in the art from this detailed description. Hence, it is to be understood that this disclosure is not limited to the particular component parts of the device described or steps of the methods described as such device and method may vary. It is also to be understood that the terminology used herein is for purpose of describing particular embodiments only, and is not intended to be limiting. It must be noted that, as used in the specification and the appended claim, the articles "a," "an," "the," and "said" are intended to mean that there are one or more of the elements unless the context clearly dictates otherwise. Thus, for example, reference to "a sensor" or "the sensor" may include several sensors, and the like. Furthermore, the word "comprising" does not exclude other elements or steps.

BRIEF DESCRIPTION OF THE DRAWINGS

Other features and advantages of the present invention will become apparent from the following detailed description of a presently preferred embodiment, with reference to the accompanying drawings, in which.

Further, in the figures like reference characters designate like or corresponding parts throughout the several figures.

DETAILED DESCRIPTION

Figure 1:
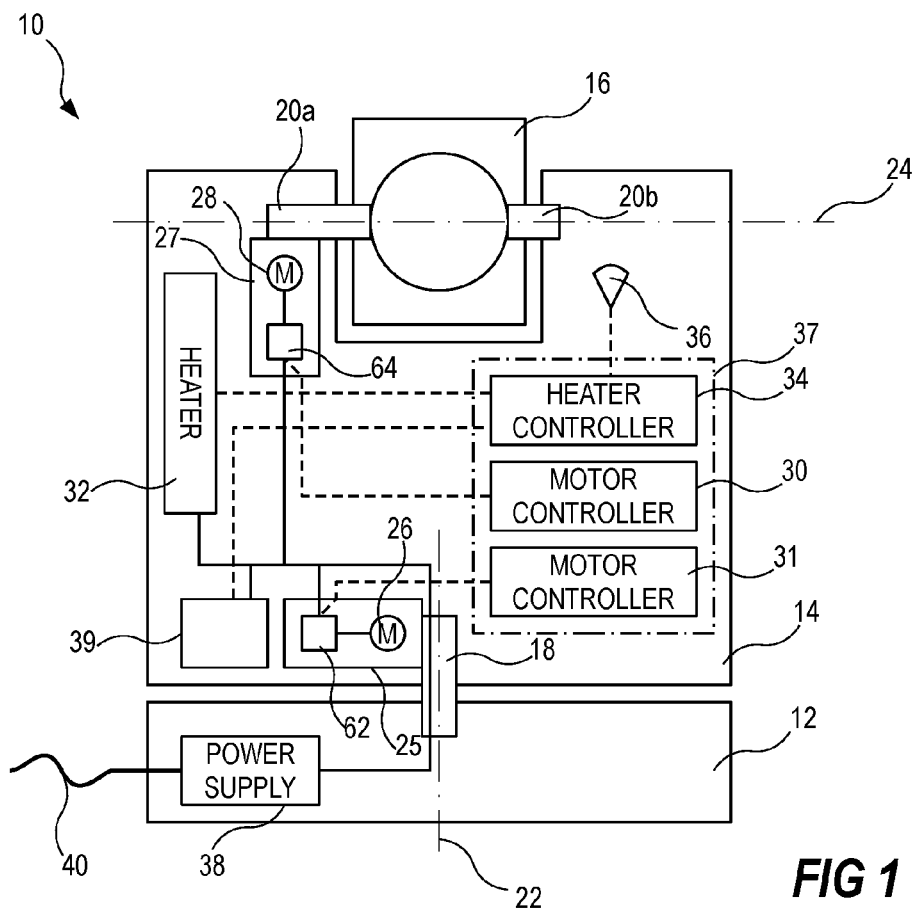
FIG. 1 is a schematic block diagram of a camera assembly according to embodiments of the invention.

The present invention relates to a motorized camera directing arrangement. FIG. 1 shows a motorized camera directing device combined with a camera, which may be described as a camera including a motorized camera directing device. The motorized camera directing arrangement may include a mounting bracket for a camera instead of the camera itself being incorporated with the motorized camera directing arrangement, i.e. the motorized camera directing device may be seen as a camera accessory arranged to add functionality to the image capturing operation to be performed by a camera mounted thereto. Accordingly, the motorized camera directing arrangement may be a camera including motors and pivot shafts for enabling controlled movement of the camera view or it may be a device having a mounting bracket for supporting a camera and which have motors for controlled movement of the mounting bracket and, when mounted, a camera.

FIG. 1 shows the motorized camera directing arrangement 10 which is arranged for pan and tilt movement of the image view of a camera 16. The motorized camera directing arrangement 10 includes a base 12, an intermediate device 14, and the camera 16. The intermediate device 14 is turn ably connected to the base 12 by means of a pivot shaft 18 and the camera 16 is turn ably connected to the intermediate device 14 by means of pivot axes 20a-b. The pivot shaft 18 connecting the intermediate device 14 to the base 12 is arranged to enable the intermediate device 14 to turn in a first direction around a first axis 22 and the pivot shafts 20a-b connecting the camera 16 to the intermediate device 14 are arranged to enable the camera to turn in a second direction around a second axis 24. The pivot shafts 18 and 20a-b are arranged so that the second axis 24 is orthogonal to the first axis 22.

The turning of the intermediate device 14 around the first axis 22 is performed by means of a first motor device 25 being arranged in the intermediate device to interact with the pivot shaft 18, the base 12, and the intermediate device in any manner known to the skilled person. The turning of the camera 16 around the second axis 24 is performed by means of a second motor device 27. The motor devices 25 and 27 may each include a motor 26, 28, and a motor driver 62, 64. The motor devices 25 and 27 are controlled by motor controllers 30 and 31. The motor controllers 30, 31, may be implemented by means of program code executed in a processing unit 37.

In some embodiments the motors 26 and 28 are Brushless DC motors (BLDC motors). For these embodiments the design and implementation of the motor device 25, 27 and motor controller 30, 31 may be as described in the publication "Brushless DC Motor Control Made Easy", DS00857A, from Microchip Technology Incorporated, published 2002, and authored by Ward Brown. Other examples are given in "Six Step Trapezoidal Control of a BLDC Motor Using Back-EMF", REU05B0073-0101/Rev.1.01, published in February 2009 by Renesas Electronics Corporation, in "3-Phase BLDC Motor Control with Hall Sensors Using 56800/E Digital Signal Controllers", AN1916 Rev. 2.0, 11/2005, authored by Leonard N. Elevich, Published by Freescale Semiconductor, Inc. 2005, and in "BLDC Motor Control with Hall Effect Sensors Using MQX on Kinetis", AN4376 Rev. 0, 10/2011, authored by Ivan Lovas from Freescale Czech System Laboratories, published by Freescale Semiconductor, Inc., 2011. According to alternative embodiments the motor device is an ordinary DC-motor or a stepper motor controlled by a motor controller in any manner known to the skilled person.

The motorized camera directing arrangement 10 further includes a heater 32, a heater controller 34, and a temperature sensor 36. The heater 32 may be any type of resistive heating arrangement, e.g., a wire being warmed by current flowing through it, a current conducting trace on a rigid or a flexible printed circuit board, etc. The heater controller 34 may be implemented as program code running in the processing unit 37. The heater controller 34 is arranged to control the temperature of the motorized camera directing arrangement 10, especially to make sure the motorized camera directing arrangement 10 is not too cold, using inputs from the temperature sensor 36 and controlling the energy sent to or requested by the heater 32. The operation of some embodiments of the heater controller will be described below. The heater controller functionality may alternatively be implemented using logic circuits, field programmable arrays, ASICs, etc.

A power supply 38 is included in the motorized camera directing arrangement 10. The power supply is arranged in the base 12 and receives external power via a feeding line 40. Depending on the characteristics of the power received via the feeding line 40 at the power supply 38, the power supply may be a connection device arranged to distribute the physical power lines for the motors 26, 28 and the heater 32. Alternatively, the power supply may include power supply module including a transformer, a rectifier, and/or other electrical devices for adapting the power from the feeding line to the required power of the system. The motorized camera directing arrangement 10 also includes power circuitry 39. The power circuitry 39 may include some measuring sensors, e.g., a sensor measuring voltage and a sensor measuring current, discussed in more detail below, and a capacitor acting as a current buffer, also discussed in more detail below.

Figure 2:
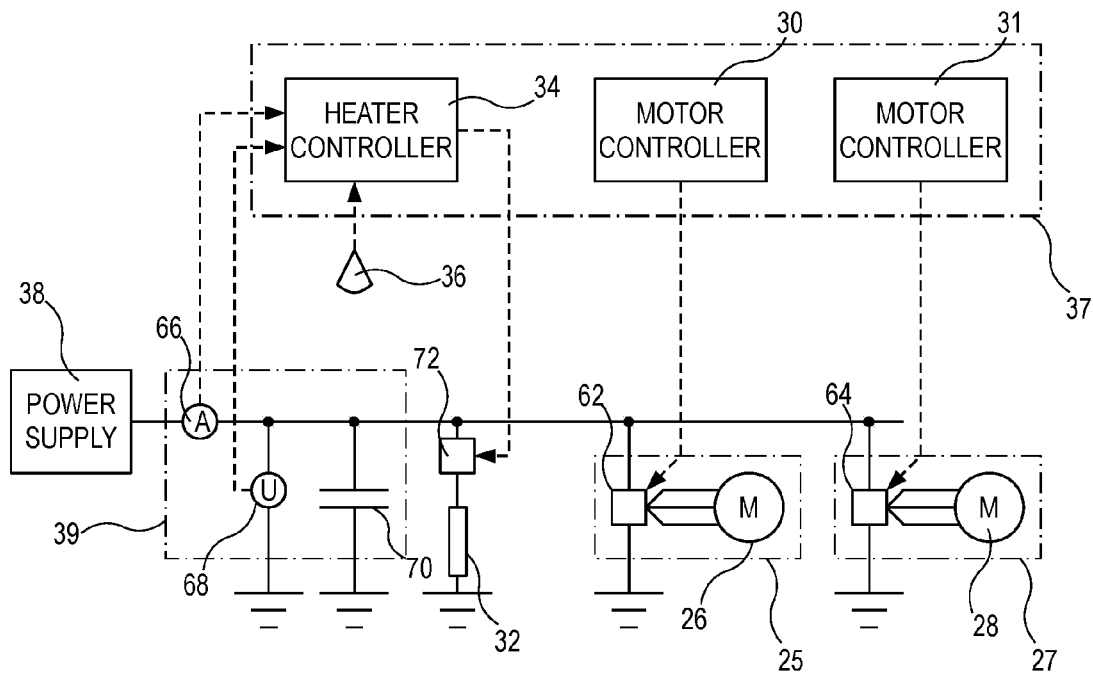
FIG. 2 is a schematic diagram of electrical connections for heaters, motors, and measuring devices.

Now referring to FIG. 2 in which a schematic electric circuit diagram of possible embodiments is showed. The motor devices 25 and 27 are controlled by means of the motor controllers 30 and 31 sending control signals to separate control devices 62, 64 one for each motor device 25, 27 and thereby each motor 26, 28. Each control device 62, 64 controls characteristics of the power feed to the motor 26, 28 from the power supply 38 in order to control the rotation of the motor 26, 28. In the case of the motors being BLDC motors the control devices generate three phase driving power to the motors based on signals received from the motor controllers 30, 31. The motor controllers 30, 31, may be arranged to control the motors 26, 28 without input from the heater controller 34 or output to the heater controller 34. Thereby, the motor controllers 30, 31, may be kept at a low cost and at relatively low complexity, which also decreases the risk of malfunction of the motorized camera directing arrangement 10.

The heater controller 34 is arranged to receive a signal indicating the total current distributed to the heater 32, and the motors 26, 28. This signal is provided by means of a current sensor 66 arranged on a line conducting current to the heater 32, and the motors 26, 28. Further, the heater controller 34 is arranged to receive a signal indicating the voltage level over the motor devices 25, 27. In the figure this is achieved by arranging a voltage sensor 68 measuring the voltage over a capacitor 70, which is connected in parallel with the motor devices 25, 27. An output signal is generated by the heater controller based on the measured current, the measured voltage, and the measured temperature, the temperature sensor 36 is showed in FIG. 1. This output signal is connected to a control device 72 controlling the characteristics of the power provided to the heater 32 in order to vary the heating power generated or simply turn it off.

The capacitor 70 may have two effects in the circuit. One of them is that it acts as a low pass filter for high frequency ripples originating from the motor devices 25 and 27 which are controlled about 20 000 times per second. These high frequency disturbances are thereby filtered before they affect the power feeding system. The other effect is that the capacitor 70 is charged with braking effect from the motor devices 25, 27, when a motor is braking. This energy captured by the capacitor results in an increase in voltage over the capacitor which may be measured by the voltage sensor 68. The heater controller 34 is arranged to act upon such voltage increase by activating the heater 32 and thereby "burning" the excess energy and making the heater act as a braking resistor.

Figure 3:
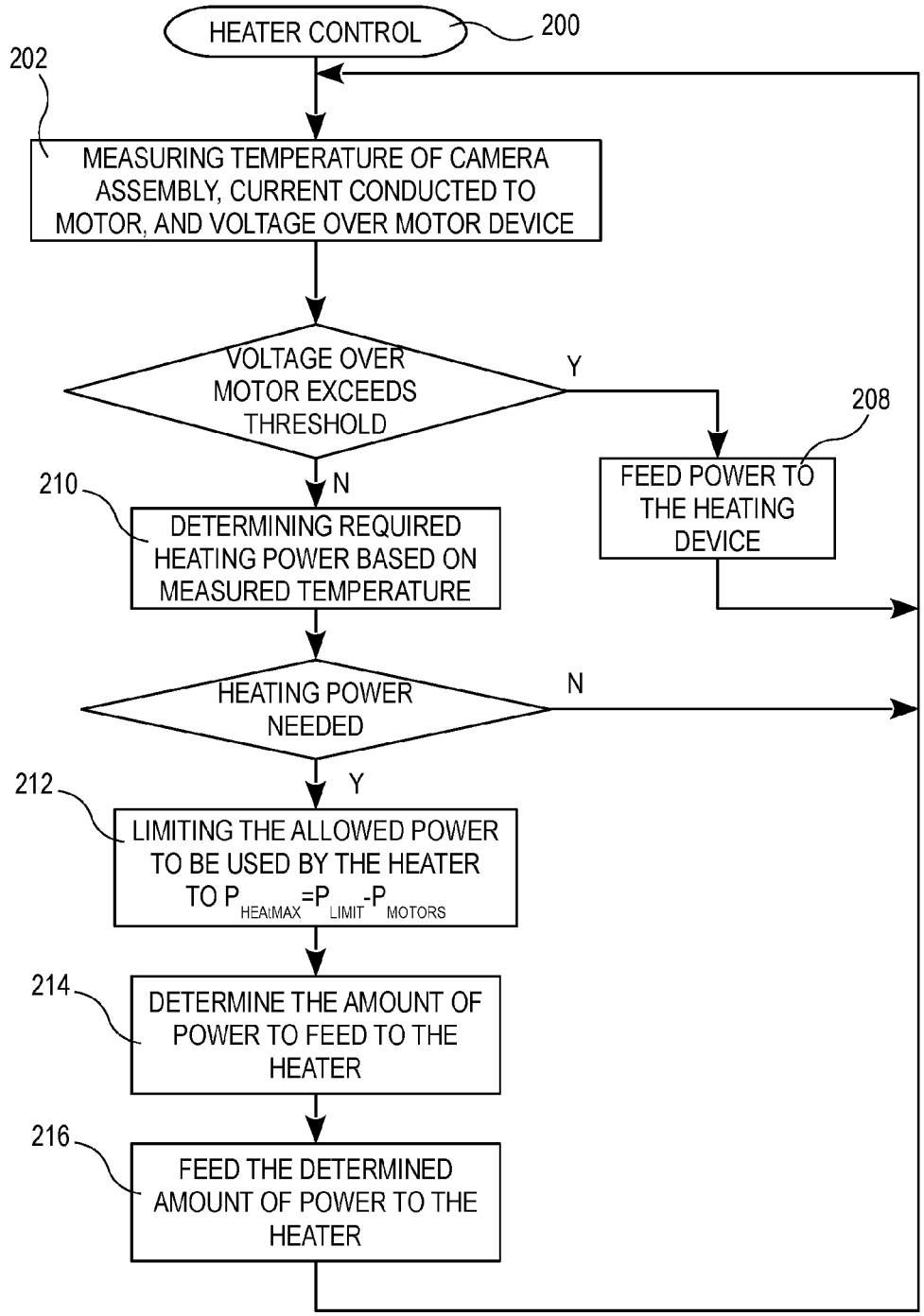
FIG. 3 is a flowchart depicting a process for controlling a heater in a camera assembly or in a motorized mounting device.

In FIG. 3 a method 200 performed by the heater controller 34 according to some embodiments is described. The method includes measuring of the temperature in the motorized camera directing arrangement 10, the current conducted to the motor and the voltage over the motor device, step 202. If the measured voltage exceeds a predetermined threshold value then the heater controller 34 will determine the power to be fed to the heating device in order to burn up excess energy, step 208. The predetermined voltage threshold may be set to a value slightly higher than the feeding power delivered for the motors. In some embodiments the normal operational voltage may be 48V with a superposed voltage wave, i.e. voltage fluctuation, of less than 3V. In such an embodiment the predetermined voltage threshold may be set to 51V. The skilled person realizes that other voltages are equally suitable for the present implementation. The system is not necessarily limited to a 48V system, but may be a system implementing any voltage, e.g., it may be a system implementing anything from 3V to 230V. The superimposed voltage wave may be 5% of the system voltage, however, this may also vary depending on how well the power supply is performing.

The higher voltage value arranged to trigger the heater controller to start the heating may be a result of a motor device 25, 27, applying electrical brakes which generate power instead of consuming power, and thereby charging the capacitor 70 in the circuit, resulting in a higher voltage measured over the motor device 25, 27, and the capacitor 70, as they are connected in parallel. The method returns to step 202 in order to continue monitoring the motorized camera directing arrangement 10.

If the measured voltage does not exceed the threshold, then a required heating power is determined based on the measured temperature, step 210. The control of the heating power may be simple, e.g. if the temperature falls below a certain temperature threshold, heating power is required and if not, no heating power is required. In other embodiments the heating power may be proportional to the decrease in temperature when the temperature is below a threshold temperature or the heating power may be determined from a plurality of threshold temperatures, each threshold resulting in a different amount of heating power, e.g., more heating power at lower temperature. If no heating power is needed, then the heater controller 34 returns to step 202 for measuring. However, if heating power is required, the heater controller 34 is also designed to limit the total amount of power used by the motorized camera directing arrangement 10. In embodiments operating according to the method of FIG. 3 this is achieved by calculating a maximum power limit, $P_{HEATMAX}$, for the heater based on the measured current, which is indicating the power used by the motors $P_{MOTORS}$, and a power limit for the system, $P_{LIMIT}$, step 212. This power limit is then applied when determining the amount of power to feed to the heater 32, e.g., by allowing the heater 32 to use power up to the value of $P_{HEATMAX}$. Accordingly, if the required heating power determined in step 210 is below or equal to $P_{HEATMAX}$ the heater 32 is allowed to use the required heating power. On the other hand, if the required heating power exceeds the value of $P_{HEATMAX}$ then the power determined for the heater 32 is equal to $P_{HEATMAX}$. When the amount of power to be sent to the heater 32 has been determined the heater controller 34 sends signals to the heater control device 72 to feed the determined amount to the heater 32, step 216. Then the process returns and measures the temperature, current, and voltage again, step 202.

According to alternative embodiments, the limiting of the heating power based on power used by the motors is simply designed not to allow any heating at the same time as the motors are in use, e.g., as long as any one of the motors is drawing power.

Moreover, as mentioned previously the power feed may present a voltage that is 48V having a 5% 100 Hz sinus wave shaped voltage signal superimposed. The voltage levels and the frequency may of course have other values, as presented above. In this case, any of the controllers, or all of them, may be arranged to make a load, e.g., the heater 32, draw current at the peak, or during a time period including the peak, of the superimposed voltage in order to have the system draw as little current as possible.

What is claimed is:

1. Method for controlling a heating device in a motorized camera directing arrangement including a motor device, the method comprising:
    measuring a voltage over the motor device;
    measuring a current conducted at least to the motor device;
    measuring a temperature relating to the motorized camera directing arrangement;
    controlling power distributed to the heating device based on the measured temperature and on the measured current; and
    feeding power to the heating device independent of the measured temperature and the measured current in the event that the measuring of the voltage over the motor device indicates a voltage level higher than a predetermined threshold value.

2. The method according to claim 1, wherein the measuring of the current is arranged so that the combined current to the motor device and the heating device is measured.

3. The method according to claim 1, wherein controlling of the power distributed to the heating device also is based on the measured voltage.

4. The method according to claim 1, wherein the controlling of the power distributed to the heating device further comprises dynamically setting a power limit for the heating device based on measured current and dynamically controlling the power distribution to the heating device so that the power limit is not exceeded.

5. The method according to claim 1, wherein the feeding of power to the heating device, in the event that the measuring of the voltage over the motor device indicates a voltage level higher than a predetermined threshold value, further includes comparing the measured voltage over the motor device to a plurality of predetermined threshold values representing discretely increasing voltages and feeding a different amount of power to the heating device depending on the threshold exceeded by the measured voltage.

6. The method according to claim 1, wherein the voltage over the motor device is measured over a capacitor arranged in parallel with the motor device.

7. The method according to claim 1, wherein the motor device is a first motor device of the motorized camera directing arrangement and the motorized camera directing arrangement includes a second motor device.

8. The method according to claim 1, wherein the current measured is the current distributed to at least the motor devices and the heating device of the motorized camera directing arrangement.

9. A motorized camera directing arrangement comprising:
    a motor device, a motor controller, a power supply, a voltage sensor configured to measure a voltage over the motor device, a current sensor configured to measure a current conducted at least to the motor device, a temperature sensor configured to measure a temperature relating to the motorized camera directing arrangement, a heating device, and a heater controller configured to control power distributed to the heating device based on the measured temperature and on the measured current and feed power to the heating device independent of the measured temperature and the measured current in the event that the measuring of the voltage over the motor device indicates a voltage level higher than a predetermined threshold value.

10. The motorized camera directing arrangement according to claim 9, wherein the motor device includes a motor driver and a motor.

11. The motorized camera directing arrangement according to claim 9, further comprising a mounting bracket for attaching a camera to the motorized camera directing arrangement.

12. A camera comprising:
    a motorized camera directing arrangement including a motor device, a motor controller, a power supply, a voltage sensor configured to measure a voltage over the motor device, a current sensor configured to measure a current conducted at least to the motor device, a temperature sensor configured to measure a temperature relating to the motorized camera directing arrangement, a heating device, and a heater controller configured to control power distributed to the heating device based on the measured temperature and on the measured current and feed power to the heating device independent of the measured temperature and the measured current in the event that the measuring of the voltage over the motor device indicates a voltage level higher than a predetermined threshold value.

* * * * *